United States Patent
Huang

(10) Patent No.: US 12,249,585 B2
(45) Date of Patent: *Mar. 11, 2025

(54) SEMICONDUCTOR DEVICE PACKAGE

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,586

(22) Filed: Feb. 20, 2024

(65) Prior Publication Data

US 2024/0194620 A1 Jun. 13, 2024

Related U.S. Application Data

(63) Continuation of application No. 17/724,422, filed on Apr. 19, 2022, now Pat. No. 11,908,815, which is a
(Continued)

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 21/565* (2013.01);
(Continued)

(58) Field of Classification Search
CPC ... H01L 23/66; H01L 21/4857; H01L 21/565; H01L 23/3121; H01L 23/49822;
(Continued)

(56) References Cited

U.S. PATENT DOCUMENTS

| 5,757,611 A | 5/1998 | Gurkovich et al. |
| 11,309,264 B2 | 4/2022 | Huang |

(Continued)

FOREIGN PATENT DOCUMENTS

| CN | 108074905 A | 5/2018 |
| CN | 110277628 A | 9/2019 |

OTHER PUBLICATIONS

Non-Final Office Action for U.S. Appl. No. 17/724,422, issued Jul. 5, 2023, 6 pages.
(Continued)

*Primary Examiner* — Caleen O Sullivan
(74) *Attorney, Agent, or Firm* — FOLEY & LARDNER LLP

(57) ABSTRACT

The present disclosure provides a semiconductor device package. The semiconductor device package includes an antenna layer, a first circuit layer and a second circuit layer. The antenna layer has a first coefficient of thermal expansion (CTE). The first circuit layer is disposed over the antenna layer. The first circuit layer has a second CTE. The second circuit layer is disposed over the antenna layer. The second circuit layer has a third CTE. A difference between the first CTE and the second CTE is less than a difference between the first CTE and the third CTE.

20 Claims, 15 Drawing Sheets

Related U.S. Application Data continuation of application No. 16/833,330, filed on Mar. 27, 2020, now Pat. No. 11,309,264.

(51) Int. Cl.
  *H01L 21/56* (2006.01)
  *H01L 23/00* (2006.01)
  *H01L 23/31* (2006.01)
  *H01L 23/498* (2006.01)
  *H01Q 1/22* (2006.01)

(52) U.S. Cl.
  CPC .... *H01L 23/3121* (2013.01); *H01L 23/49822* (2013.01); *H01L 23/49838* (2013.01); *H01L 23/562* (2013.01); *H01Q 1/2283* (2013.01); *H01L 2223/6677* (2013.01)

(58) Field of Classification Search
  CPC ............. H01L 23/49838; H01L 23/562; H01L 2223/6677; H01L 23/5383; H01Q 1/2283
  USPC ........................................................ 257/428
  See application file for complete search history.

(56) References Cited

U.S. PATENT DOCUMENTS

| | | | |
|---|---|---|---|
| 11,309,639 | B2 | 4/2022 | Chang et al. |
| 11,908,815 | B2 * | 2/2024 | Huang ................ H01Q 1/2283 |
| 2008/0132053 | A1 | 6/2008 | Wu et al. |
| 2011/0187602 | A1 | 8/2011 | Nair et al. |
| 2018/0139844 | A1 | 5/2018 | You |
| 2019/0164912 | A1 | 5/2019 | Lee et al. |
| 2020/0098709 | A1 | 3/2020 | Lin et al. |
| 2021/0066156 | A1 | 3/2021 | Huang |
| 2021/0257745 | A1 | 8/2021 | Liao et al. |

OTHER PUBLICATIONS

Notice of Allowance for U.S. Appl. No. 16/833,330, issued Dec. 20, 2021, 12 pages.
Notice of Allowance for U.S. Appl. No. 17/724,422, issued Oct. 16, 2023, 7 pages.
Office Action for corresponding Chinese Application No. 202011229549.X, dated Dec. 20, 2024, 5 pages.
Search Report with English Translation for corresponding Chinese Application No. 202011229549.X, dated Dec. 20, 2024, 4 pages.

* cited by examiner

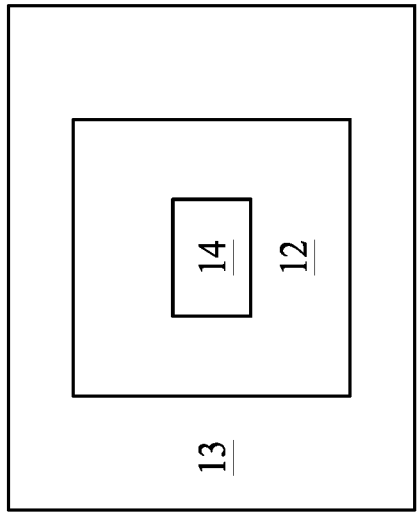
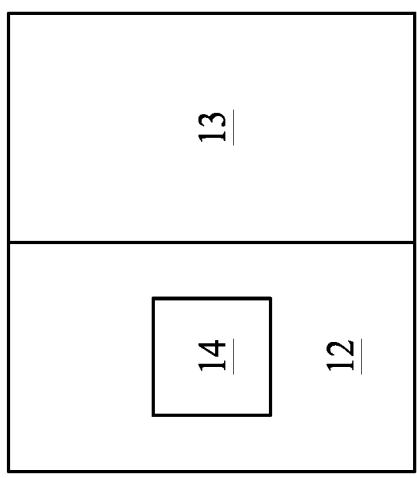
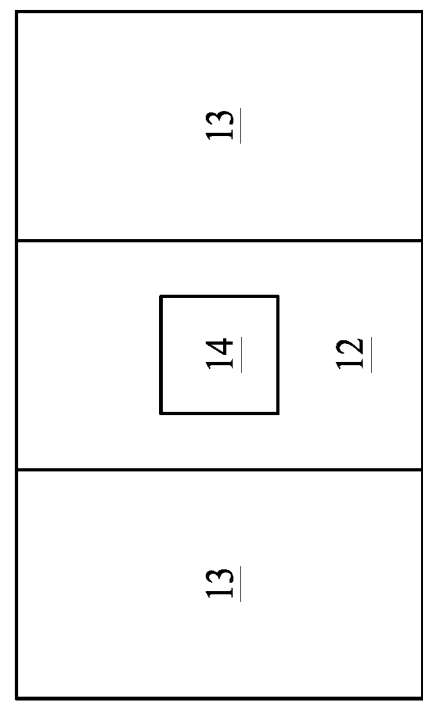

SEMICONDUCTOR DEVICE PACKAGE

CROSS-REFERENCE TO RELATED APPLICATION

This application is a continuation of U.S. patent application Ser. No. 17/724,422, filed Apr. 19, 2022, now U.S. Pat. No. 11,908,815, which is a continuation of U.S. patent application Ser. No. 16/833,330 filed Mar. 27, 2020, now U.S. Pat. No. 11,309,264 the contents of which are incorporated herein by reference in their entirety.

BACKGROUND

1. Technical Field

The present disclosure generally relates to a semiconductor device package and a method of manufacturing the same, and to a semiconductor device package including an antenna.

2. Description of the Related Art

Semiconductor device package(s) having antennas for signal (e.g. radio frequency (RF) signal) transmission may include an antenna layer and an RF routing layer electrically connected to the antenna layer. To improve the radiation efficiency of the antenna layer, the antenna layer generally has a substrate with a relatively low dielectric constant (Dk) and loss tangent or dissipation factor (Df), which is different from a substrate of the RF routing layer. Such unbalanced structure would cause a warpage issue during the manufacturing process, which may result in the failure of the semiconductor device package.

SUMMARY

In one or more embodiments, a semiconductor device package includes an antenna layer, a first circuit layer and a second circuit layer. The antenna layer has a first coefficient of thermal expansion (CTE). The first circuit layer is disposed over the antenna layer. The first circuit layer has a second CTE. The second circuit layer is disposed over the antenna layer. The second circuit layer has a third CTE. A difference between the first CTE and the second CTE is less than a difference between the first CTE and the third CTE.

In one or more embodiments, a semiconductor device package includes a substrate, a first circuit layer and a second circuit layer. The substrate has a first surface and a second surface opposite to the first surface. The first circuit layer is disposed on the first surface of the substrate. The first circuit layer has a first conductive layer and a first dielectric layer at least partially covering the first conductive layer. The second circuit layer is disposed on the first surface of the substrate. The second circuit layer has a second conductive layer and a second dielectric layer at least partially covering the second conductive layer. A dielectric constant (Dk) of the first dielectric layer is less than a Dk of the second dielectric layer.

In one or more embodiments, a method of manufacturing a semiconductor device package includes (a) providing an antenna substrate having a first surface and a second surface opposite to the first surface; (b) connecting a first circuit layer on the first surface of the substrate; (c) connecting a second circuit layer on the first surface of the substrate; and (d) forming a package body to cover the first circuit layer and the second circuit layer, wherein package body further extends between the first circuit layer and the second layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 2B illustrates a top view of a semiconductor device package in accordance with some embodiments of the present disclosure.

FIG. 2C illustrates a top view of a semiconductor device package in accordance with some embodiments of the present disclosure.

FIG. 2D illustrates a top view of a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
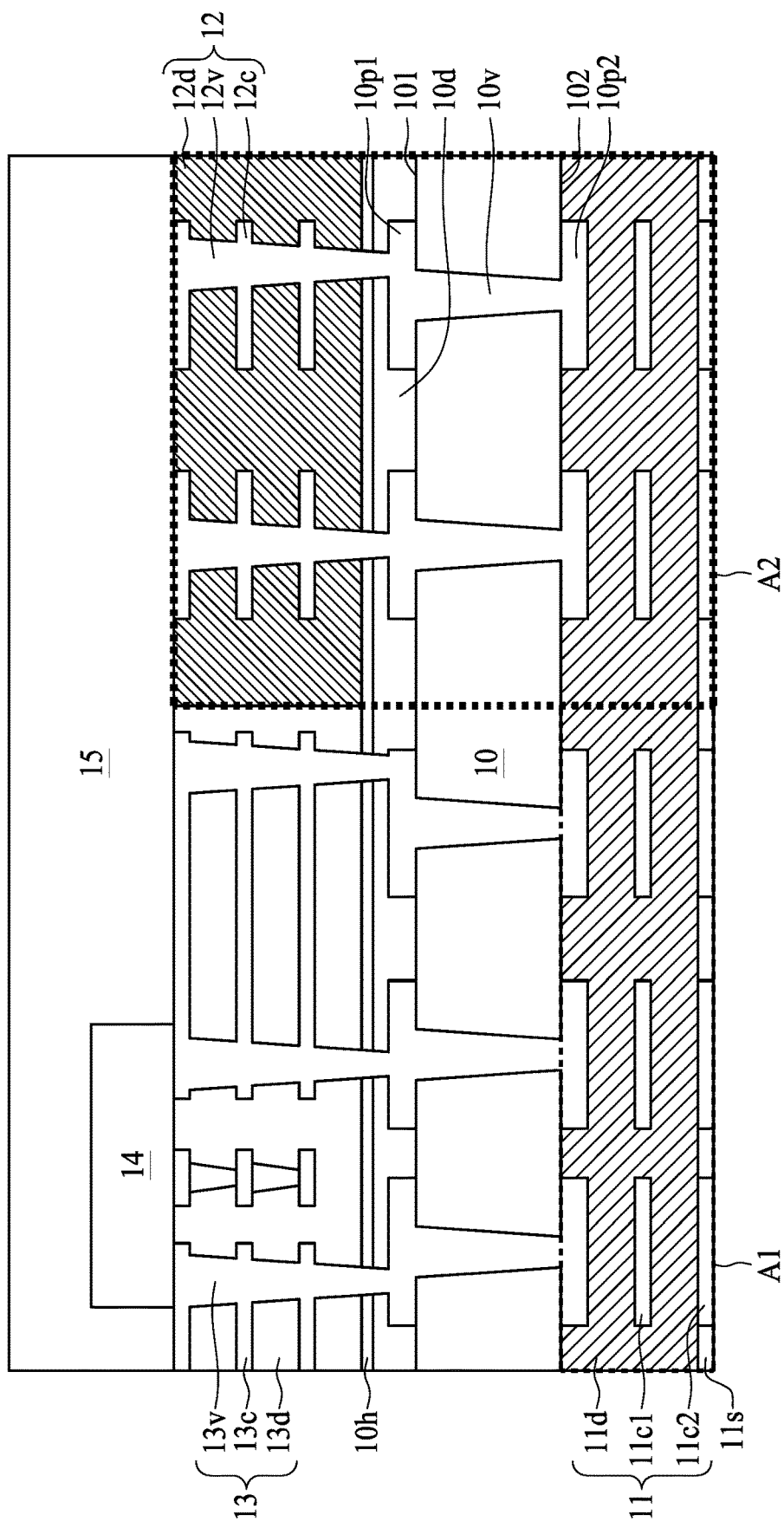
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes a substrate 10, an antenna layer 11, circuit layers 12, 13, an electronic component 14 and a package body 15.

The substrate 10 has a surface 101 and a surface 102 opposite to the surface 101. The substrate 10 may be, for example, a printed circuit board, such as a paper-based copper foil laminate, a composite copper foil laminate, or a polymer-impregnated glass-fiber-based copper foil laminate. In some embodiments, the substrate 10 may be a multi-layer substrate which includes a core layer and a conductive material and/or structure. For example, the substrate 10 includes a core portion, and may be in a wafer type, a panel type or a strip type. The substrate 10 may include one or more conductive layers $10p1$, $10p2$ in proximity to, adjacent to, or embedded in and exposed at both surfaces (e.g., the surfaces 101 and 102) of the substrate 10. In some embodiments, the substrate 10 includes a through via $10v$ penetrating the substrate 10 to electrically connect the conductive layer $10p1$ with the conductive layer $10p2$. In some embodiments, a protection layer $10d$ (e.g., levelling layer) may be disposed on the surface 101 of the substrate 10 to cover the conductive layer $10p1$. For example, a lateral surface and a top surface of the conductive layer $10p1$ may be covered by and in contact with the protection layer $10d$.

In some embodiments, the substrate 10 or a portion of the substrate 10 and the antenna layer 11 may serve as an antenna region. In some embodiments, the through via $10v$ of the substrate 10 may serve as a feeding via (or feeding port) of the antenna region. The thickness of the substrate 10 may serve as the height of the resonator (or resonant cavity) for RF signal emitted by or received from the antenna region.

The antenna layer 11 is disposed on the surface 102 of the substrate 10. In some embodiments, the antenna layer 11 is in contact with the substrate 10. For example, the antenna layer 11 is in contact with the surface 102 of the substrate 10. The antenna layer 11 includes one or more conductive layers $11c1$, $11c2$ and one or more dielectric layers $11d$. A portion of the conductive layers $11c$ is covered or encapsulated by the dielectric layer $11d$ while another portion of the conductive layer $11c$ is exposed from the dielectric layer $11d$. In some embodiments, the dielectric layer $11d$ may cover the conductive layer $10p2$ of the substrate 10. For example, the conductive layer $10p2$ is in contact with the dielectric layer $11d$. In some embodiments, the conductive layers $11c1$, $11c2$ define or include an antenna pattern. The conductive layers $11c1$, $11c2$ may be electromagnetically coupled to the substrate 10 (e.g., to the conductive layer $10p2$) for signal transmission. In some embodiments, a protection layer $11s$ (e.g., solder resist) is disposed on a surface of the dielectric layer $11d$ facing away from the substrate 10 to cover a portion of the conductive layer $11c2$.

In some embodiments, the dielectric layers $11d$ may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, the conductive layers $11c1$, $11c2$ are, or include, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. There may be any number of the dielectric layers $11d$ and conductive layers $11c1$, $11c2$ depending on different design specifications.

The circuit layer 12 is disposed on the surface 101 of the substrate 10. In some embodiments, the circuit layer 12 is connected to the protection layer $10d$ through an adhesive layer $10h$ (e.g., a tape or a die attach film (DAF)). The circuit layer 12 includes one or more conductive layers $12c$ and one or more dielectric layers $12d$. A portion of the conductive layer $12c$ is covered or encapsulated by the dielectric layer $12d$ while another portion of the conductive layer $12c$ is exposed from the dielectric layer $12d$. In some embodiments, the circuit layer 12 may include conductive vias $12v$ (e.g., through vias) penetrating the dielectric layer $12d$, the adhesive layer $10h$ and the protection layer $10d$ to be electrically connected to the conductive layer $10p1$. For example, the conductive vias $12v$ are in contact with the conductive layer $10p1$. In some embodiments, the conductive layer $12c$ defines or includes an antenna pattern. The conductive layer $12c$ may be electrically connected to the substrate 10 (e.g., to the conductive layer $10p1$) through the conductive via $12v$ for signal transmission.

In some embodiments, the dielectric layers $12d$ may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, the dielectric layer $12d$ and the dielectric layer $11d$ may include the same material. Alternatively, the dielectric layer $12d$ and the dielectric layer $11d$ may include different materials. In some embodiments, the conductive layer $12c$ and the conductive vias $12v$ are, or include, a conductive material such as a metal or metal alloy. Examples of the conductive material include Au, Ag, Cu, Pt, Pd, other metal(s) or alloy(s), or a combination of two or more thereof. There may be any number of the dielectric layers $12d$ and conductive layers $12c$ depending on different design specifications.

In some embodiments, as shown in FIG. 1A, a portion of the antenna layer 11 and a portion of the conductive layer $10p2$ of the substrate 10 encircled by a dotted-line square may define an antenna A1, and the other portion of the antenna layer 11 and the circuit layer 12 encircled by another dotted-line square may define another antenna A2. In some embodiments, the antenna A1 and the antenna A2 may include different types of antenna. Alternatively, the antenna A1 and the antenna A2 may include the same type of antenna. In some embodiments, the antenna A1 and the antenna A2 may include different operation frequencies or bandwidths. Alternatively, the antenna A1 and the antenna A2 may include the same operation frequency or bandwidth.

Figure 1C:
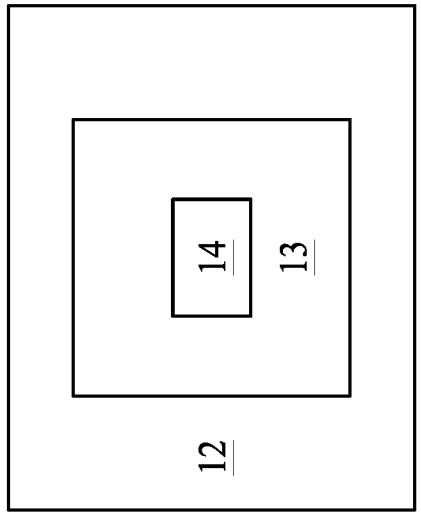
FIG. 1C illustrates a top view of a semiconductor device package in accordance with some embodiments of the present disclosure.
Figure 1B:
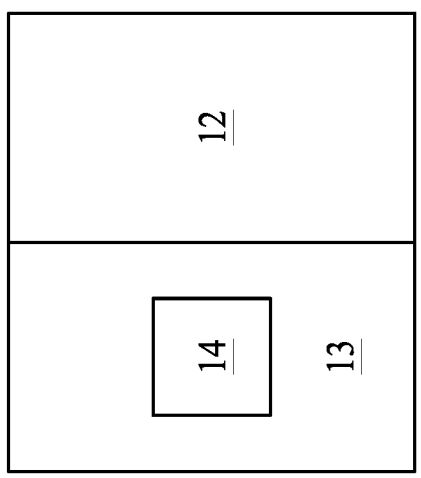
FIG. 1B illustrates a top view of a semiconductor device package in accordance with some embodiments of the present disclosure.
Figure 1D:
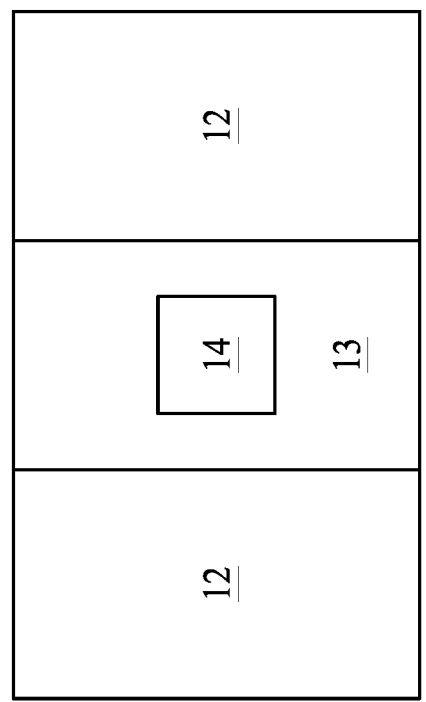
FIG. 1D illustrates a top view of a semiconductor device package in accordance with some embodiments of the present disclosure.

The circuit layer 13 (or a routing layer) is disposed on the surface 101 of the substrate 10. The circuit layer 13 is disposed adjacent to the circuit layer 12. For example, as shown in FIG. 1B (which illustrates a top view of the semiconductor device package 1 as shown in FIG. 1A, in accordance with some embodiments of the present disclosure), the circuit layer 13 and the circuit layer 12 are disposed side-by-side on the surface 101 of the substrate 10. For example, as shown in FIG. 1C (which illustrates a top view of the semiconductor device package 1 as shown in FIG. 1A, in accordance with some embodiments of the present disclosure), the circuit layer 12 surrounds the circuit layer 13. For example, as shown in FIG. 1D (which illustrates a top view of the semiconductor device package 1 as shown in FIG. 1A, in accordance with some embodiments of the present disclosure), the circuit layer 13 is disposed between the circuit layers 12. In other words, the circuit layer 13 is sandwiched by the circuit layers 12. In some embodiments, the circuit layer 12 and the circuit layer 13 are disposed at the same altitude with respect to the substrate 10 (or the antenna layer 11).

Referring to FIG. 1A, the circuit layer 13 is connected to the protection layer 10d through the adhesive layer 10h. The circuit layer 13 includes one or more conductive layers 13c and one or more dielectric layers 13d. A portion of the conductive layer 13c is covered or encapsulated by the dielectric layer 13d while another portion of the conductive layer 13c is exposed from the dielectric layer 13d. In some embodiments, the circuit layer 13 may include conductive vias 13v penetrating the dielectric layer 13d, the adhesive layer 10h and the protection layer 10d to be electrically connected to the conductive layer 10p1. The conductive layer 13c may be electrically connected to the substrate 10 (e.g., to the conductive layer 10p1) through the conductive via 13v for signal transmission. In some embodiments, the circuit layer 13 is electrically connected to the circuit layer 12 through the substrate 10 (e.g., through the conductive layer 10p1).

In some embodiments, the dielectric layer 13d may include polymers or any other suitable materials. In some embodiments, a Dk and a Df of the dielectric layer 13d is higher than a Dk and a Df of the dielectric layers 11d, 12d. For example, the dielectric layers 11d, 12d have a Dk less than approximately 5. The dielectric layers 11d, 12d have a Dk less than approximately approximately 3. The dielectric layers 11d, 12d have a Df less than approximately 0.005. The dielectric layers 11d, 12d have a Df less than approximately 0.003.

In some embodiments, a rigidity of the dielectric layer 13d is higher than a rigidity of the dielectric layers 11d, 12d. In some embodiments, a coefficient of thermal expansion (CTE) of the dielectric layers 11d, 12d is greater than a CTE of the dielectric layer 13d. For example, the CTE of the dielectric layers 11d, 12d is from about 120 $K^{-1}$ to about 150 $K^{-1}$, and the CTE of the dielectric layer 13d is from about 20 $K^{-1}$ to about 50 $K^{-1}$. In some embodiments, the dielectric layer 13d may include fibers, and the dielectric layers 11d and 12d do not include fibers.

In some embodiments, the conductive layer 13c is, or includes, a conductive material such as a metal or metal alloy. Examples of the conductive material include Au, Ag, Cu, Pt, Pd, other metal(s) or alloy(s), or a combination of two or more thereof. There may be any number of the dielectric layers 13d and conductive layers 13c depending on different design specifications. In some embodiments, a line/space (L/S or pitch or density) of the conductive layer 12c of the circuit layer 12 is higher than a L/S of the conductive layer 13c of the circuit layer 13.

In some embodiments, a thickness of the circuit layer 13 is substantially the same as a thickness of the circuit layer 12. Alternatively, the thickness of the circuit layer 13 is different from the thickness of the circuit layer 12. In some embodiments, the number of the dielectric layers 13d and conductive layers 13c of the circuit layer 13 is the same as the number of the dielectric layers 12d and conductive layers 12c of the circuit layer 12. Alternatively, the number of the dielectric layers 13d and conductive layers 13c of the circuit layer 13 is different from the number of the dielectric layers 12d and conductive layers 12c of the circuit layer 12.

The electronic component 14 is disposed on the circuit layer 13 and electrically connected to the circuit layer 13, and electrical connection may be attained by way of flip-chip or wire-bond techniques. The electronic component 14 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The package body 15 is disposed on the circuit layer 12 and the circuit layer 13 and encapsulates the electronic component 14. In some embodiments, the package body 15 includes an epoxy resin having fillers dispersed therein.

In some comparative embodiments, an antenna layer having a dielectric layer with a relatively low Dk and Df is directly disposed on a circuit layer having a dielectric layer with a relatively high Dk and Df. However, such unbalanced structure would cause a warpage issue (e.g., the warpage is larger than 5 millimeters) during the manufacturing process, which may result in the failure of the semiconductor device package. In accordance with the embodiments, as shown in FIGS. 1A to 1D, there are two kinds of circuit layers (or routing layers) disposed over the antenna layer 11, one (i.e., the circuit layer 12) having the dielectric layer 12d with the Dk and Df similar or identical to the Dk and Df of the dielectric layer 11d of the antenna layer 11, and the other (i.e., circuit layer 13) having a relatively high Dk and Df to provide a higher rigidity for the semiconductor device package 1. The warpage issue may be eliminated or mitigated.

In addition, in some embodiments of the present disclosure, since the dielectric layer 12d of the circuit layer 12 does not have fibers, a pitch of the conductive via 12v of the circuit layer 12 is less than a pitch of the conductive via 13v of the circuit layer 13. Hence, the density (or L/S) of the conductive layer 12c of the circuit layer 12 is higher than the density of the conductive layer 13c of the circuit layer 13. This would reduce the number of the conductive layers 13c of the circuit layer 13 required for signal transmission, and the thickness of the semiconductor device package 1 can be reduced as well. In some embodiments, in the case that a ratio of the area of the circuit layer 12 to the area of the circuit layer 13 is about 2:3, the number of the conductive layer 13c of the circuit layer 13 can be reduced by 1 layer. In the case that the ratio of the area of the circuit layer 12 to the area of the circuit layer 13 is about 1:1, the number of the conductive layer 13c of the circuit layer 13 can be reduced by 2 layers. In some embodiments, the ratio of the area of the circuit layer 12 to the area of the circuit layer 13 is in a ranger from about 2:3 to about 7:3. In some embodiments, a thickness of the semiconductor device package 1 is equal to or less than 950 micrometers.

Figure 2A:
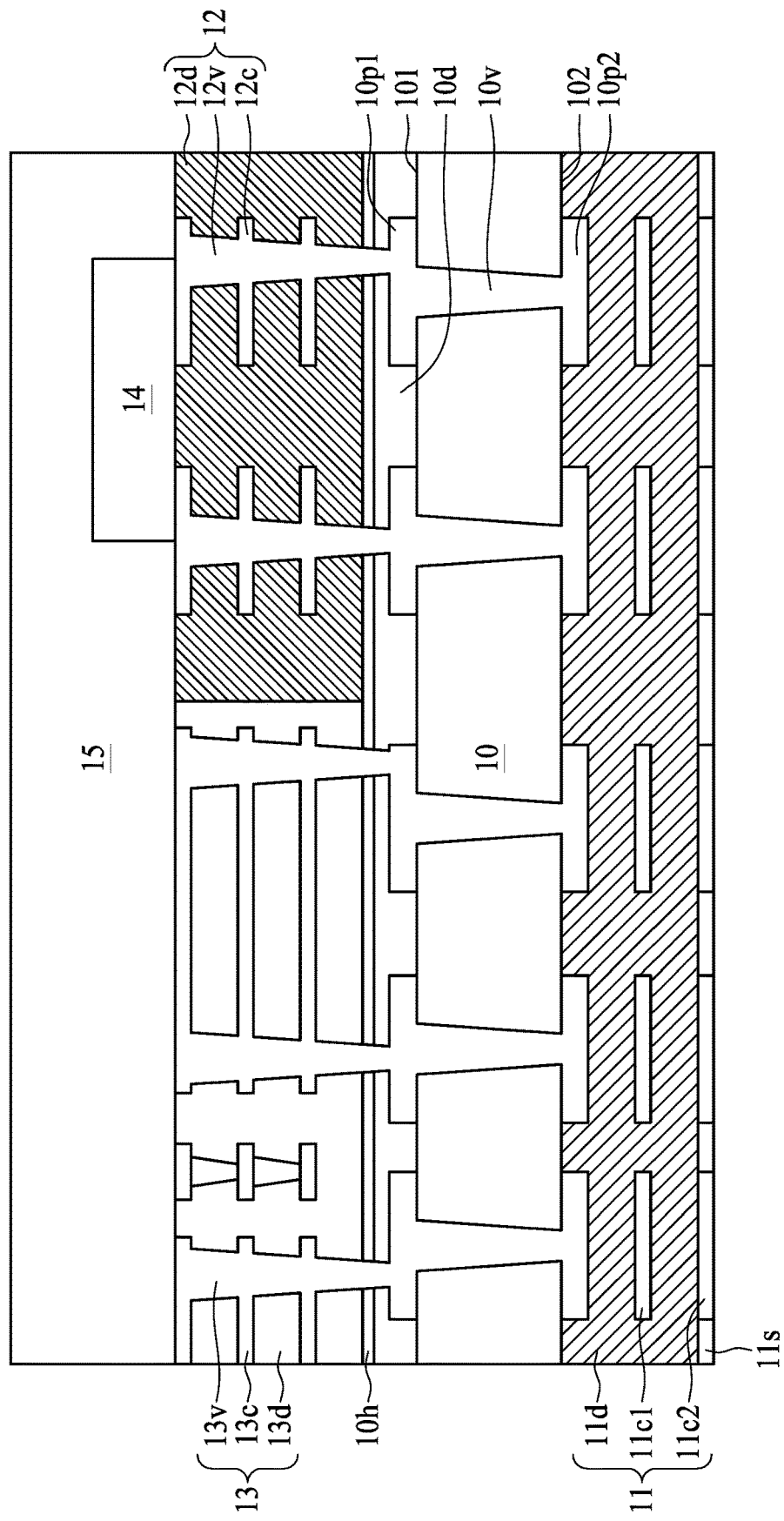
FIG. 2A illustrates a cross-sectional view of a semiconductor device package in accordance with some embodiments of the present disclosure.

FIG. 2A illustrates a cross-sectional view of a semiconductor device package 2A in accordance with some embodiments of the present disclosure. The semiconductor device package 2A is similar to the semiconductor device package 1 as shown in FIG. 1A, except that in FIG. 2A, the electronic component 14 is disposed on the circuit layer 12 and electrically connected to the circuit layer 12.

As shown in FIG. 2B (which illustrates a top view of the semiconductor device package 2A as shown in FIG. 2A, in accordance with some embodiments of the present disclosure), the circuit layer 13 and the circuit layer 12 are disposed side-by-side on the surface 101 of the substrate 10. As shown in FIG. 2C (which illustrates a top view of the semiconductor device package 2A as shown in FIG. 2A, in accordance with some embodiments of the present disclosure), the circuit layer 13 surrounds the circuit layer 12. As shown in FIG. 2D (which illustrates a top view of the semiconductor device package 2A as shown in FIG. 2A, in accordance with some embodiments of the present disclosure), the circuit layer 12 is disposed between the circuit layers 13. In other words, the circuit layer 12 is sandwiched by the circuit layers 13.

Figure 2E:
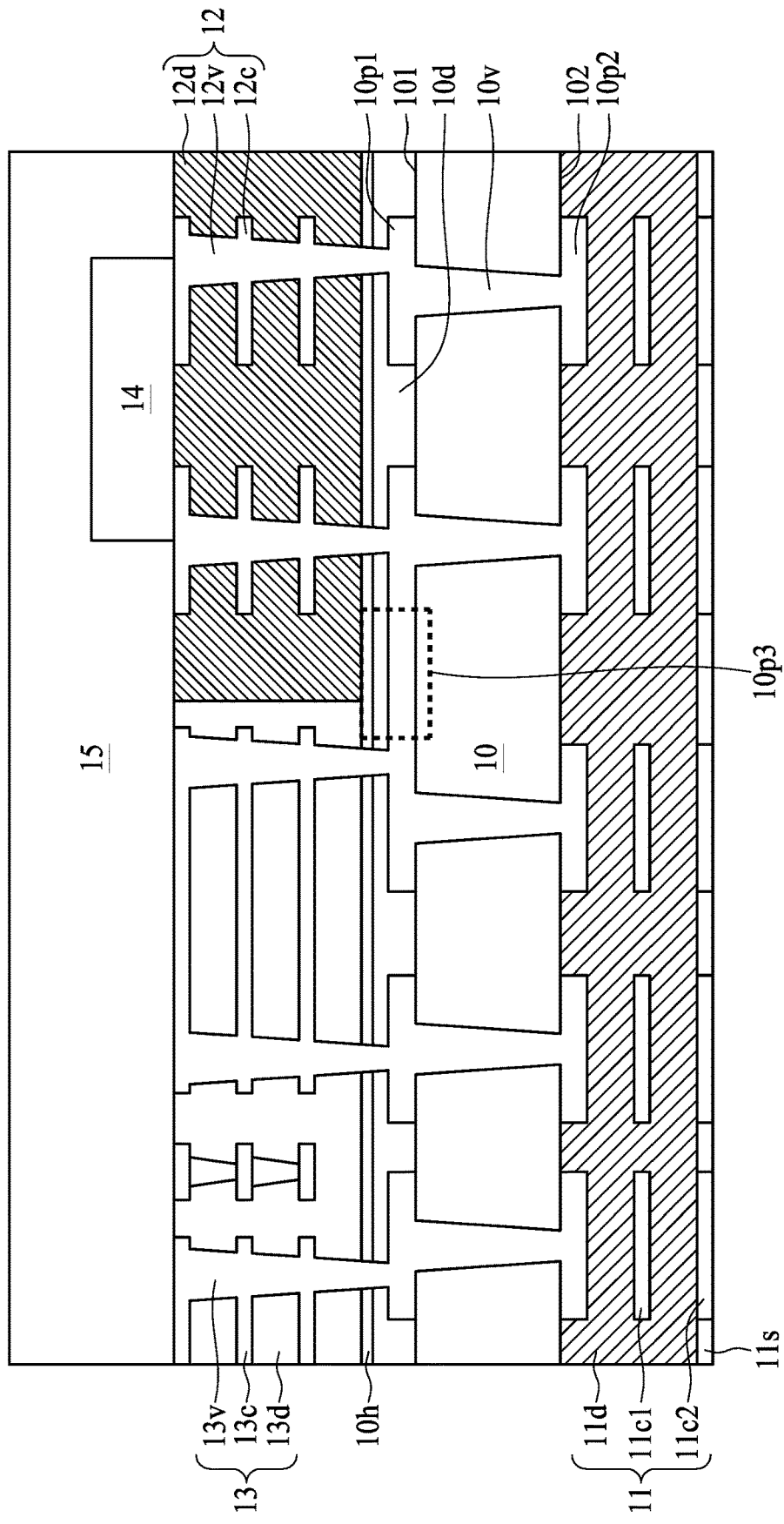
FIG. 2E illustrates a cross-sectional view of a semiconductor device package in accordance with some embodiments of the present disclosure.

FIG. 2E illustrates a cross-sectional view of a semiconductor device package 2E in accordance with some embodiments of the present disclosure. The semiconductor device package 2E is similar to the semiconductor device package 2A as shown in FIG. 2A, except that in FIG. 2A, the circuit layer 12 is electrically connected to the circuit layer 13 through a conductive layer 10$p$3 disposed on the surface 101 of the substrate 10.

Figure 3:
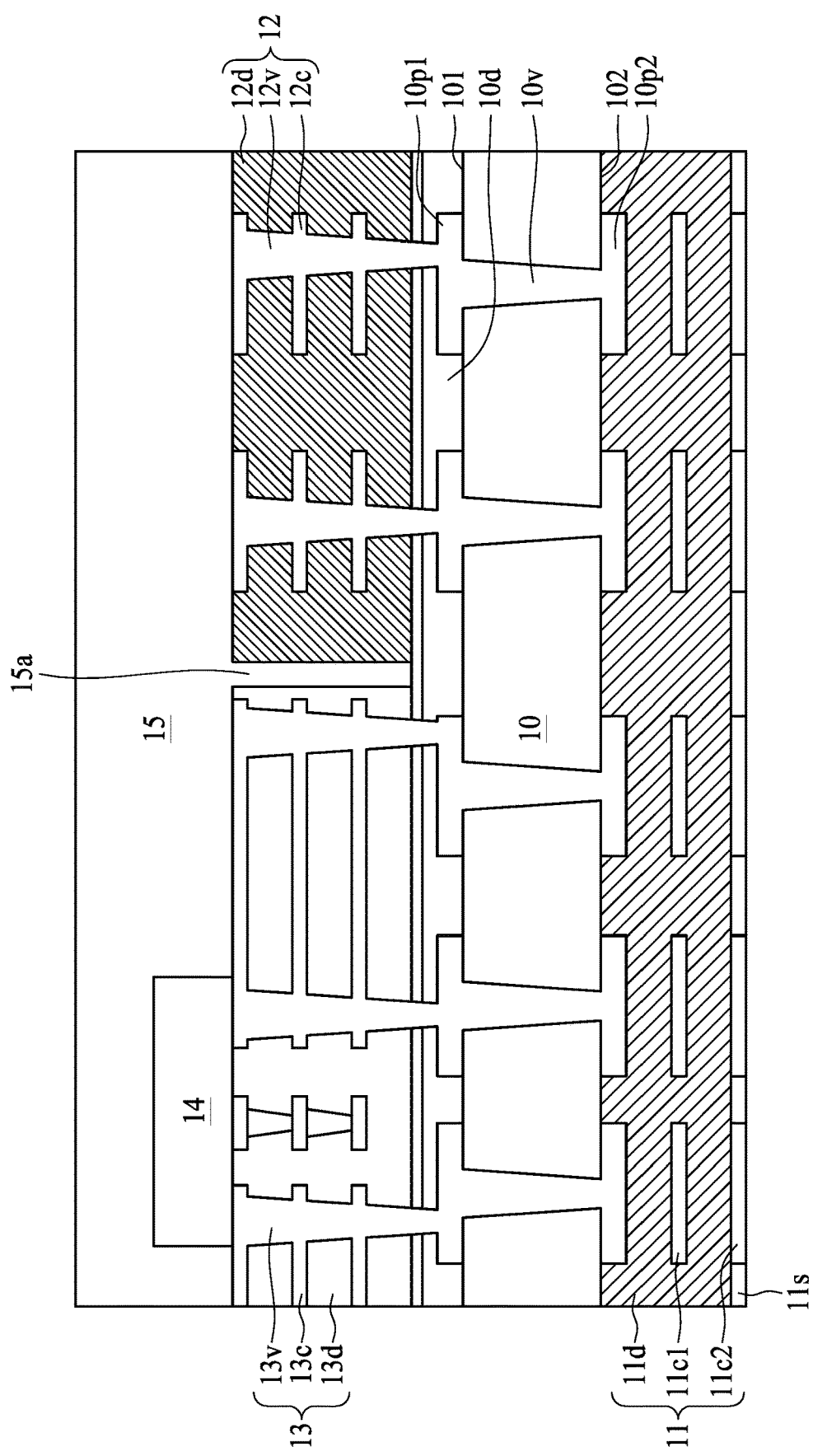
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 as shown in FIG. 1A, and the differences therebetween are described below.

As shown in FIG. 3, a portion 15$a$ of the package body 15 is disposed between the circuit layer 12 and the circuit layer 13. For example, the circuit layer 12 and the circuit layer 13 are spaced apart from each other through the package body 15. For example, a lateral surface of the circuit layer 12 facing the circuit layer 13 is in contact with the portion 15$a$ of the package body 15. For example, a lateral surface of the circuit layer 13 facing the circuit layer 12 is in contact with the portion 15$a$ of the package body 15. Using the package body 15 covering the circuit layer 12 and the circuit layer 13 and extending between the circuit layer 12 and the circuit layer 13 may prevent the circuit layer 12 from being peeled off from the circuit layer 13 (e.g., delamination issue). In some embodiments, a thickness of the portion 15$a$ of the package body 15 is equal to or greater than 150 micrometers. For example, a distance between the circuit layer 12 and the circuit layer 13 is equal to or greater than 150 micrometers.

Figure 4A:
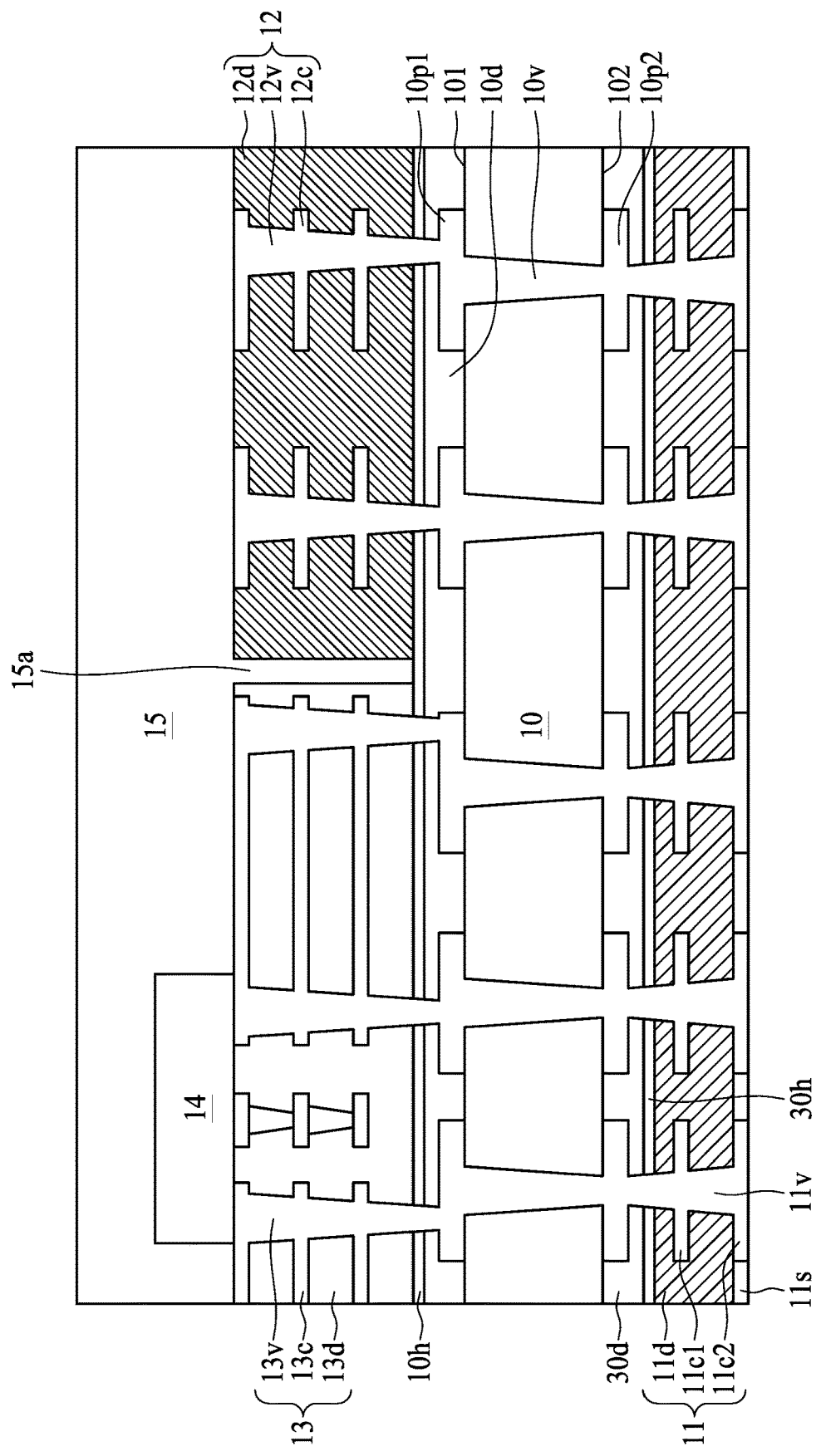
FIG. 4A illustrates a cross-sectional view of a semiconductor device package in accordance with some embodiments of the present disclosure.

FIG. 4A illustrates a cross-sectional view of a semiconductor device package 4A in accordance with some embodiments of the present disclosure. The semiconductor device package 4A is similar to the semiconductor device package 3 as shown in FIG. 3, and the differences therebetween are described below.

A protection layer 30$d$ (e.g., levelling layer) is disposed on the surface 102 of the substrate 10 to cover the conductive layer 10$p$2. For example, a lateral surface and a top surface of the conductive layer 10$p$2 may be covered by and in contact with the protection layer 30$d$.

The antenna layer 11 is connected to the protection layer 30$d$ through an adhesive layer 30$h$ (e.g., a tape or a DAF). The antenna layer 11 may include conductive vias 1$iv$ (e.g., through vias) penetrating the dielectric layer 11$d$, the adhesive layer 30$h$ and the protection layer 30$d$ to be electrically connected to the conductive layer 10$p$2. For example, the conductive vias 1$iv$ are in contact with the conductive layer 10$p$2. The conductive layer 11$c$1 may be electrically connected to the substrate 10 (e.g., to the conductive layer 10$p$2) through the conductive via 11$v$ for signal transmission. In other embodiments, the conductive via 1$iv$ may be omitted, and the signal transmission may be achieved by magnetically coupling.

Figure 4B:
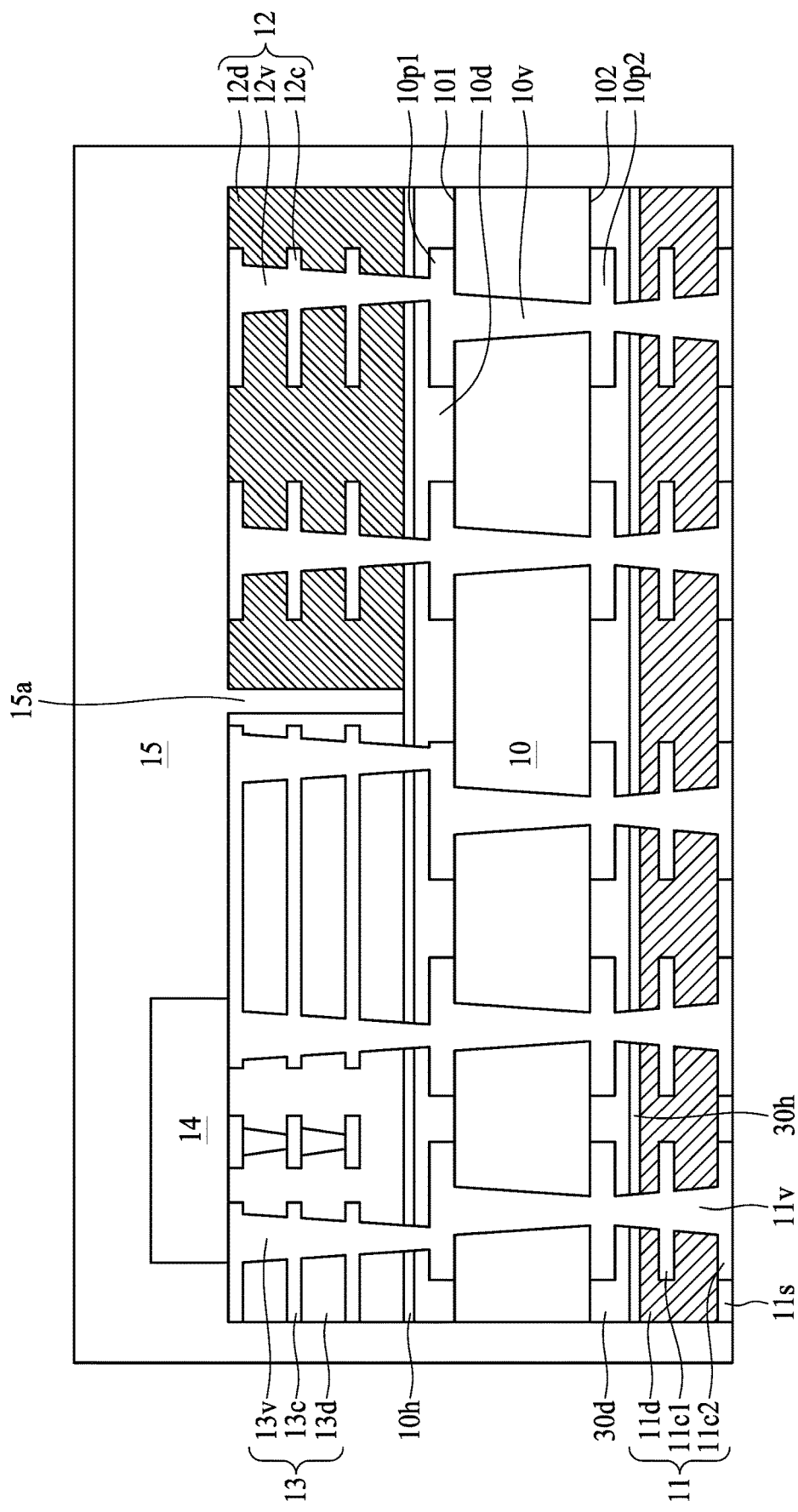
FIG. 4B illustrates a cross-sectional view of a semiconductor device package in accordance with some embodiments of the present disclosure.

FIG. 4B illustrates a cross-sectional view of a semiconductor device package 4B in accordance with some embodiments of the present disclosure. The semiconductor device package 4B is similar to the semiconductor device package 4A as shown in FIG. 4B, and the differences therebetween are described below.

The package body 15 further covers lateral surfaces of the circuit layers 12, 13, the substrate 10 and the antenna layer 11. In some embodiments, a distance between the lateral surface of the circuit layer 12 or 13 and the lateral surface of the package body 15 is in a range from about 2 millimeters to about 3 millimeters.

FIG. 5A, FIG. 5B, FIGS. 5C and 5D are cross-sectional views of a semiconductor device package at various stages of fabrication, in accordance with some embodiments of the present disclosure. At least some of these figures have been simplified for a better understanding of the aspects of the present disclosure. In some embodiments, the method illustrated in FIG. 5A, FIG. 5B, FIGS. 5C and 5D may be used to manufacture the semiconductor device package 1 as shown in FIG. 1A.

Figure 5A:
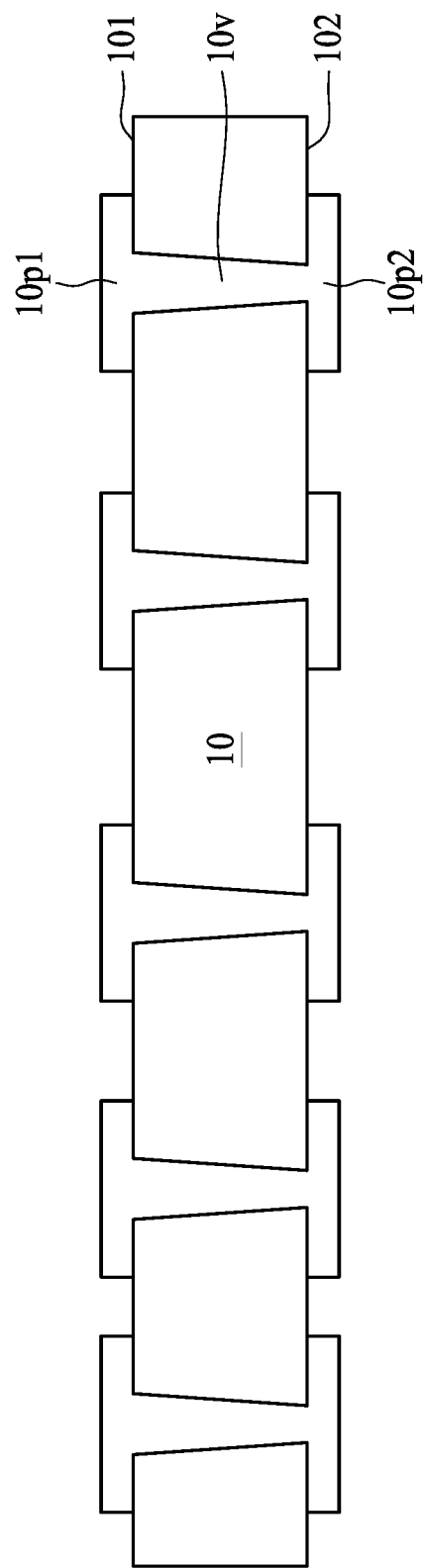
FIG. 5A, FIG. 5B, FIG. 5C and FIG. 5D illustrates one or more stages of a method of manufacturing a semiconductor device package in accordance with some embodiments of the present disclosure.

Referring to FIG. 5A, a substrate 10 (or core) is provided. Conductive layers 10$p$1 and 10$p$2 are disposed on the surfaces 101 and 102 respectively. One or more through vias 10$v$ penetrate the substrate 10 to electrically connect the conductive layer 10$p$1 with the conductive layer 10$p$2.

Figure 5B:
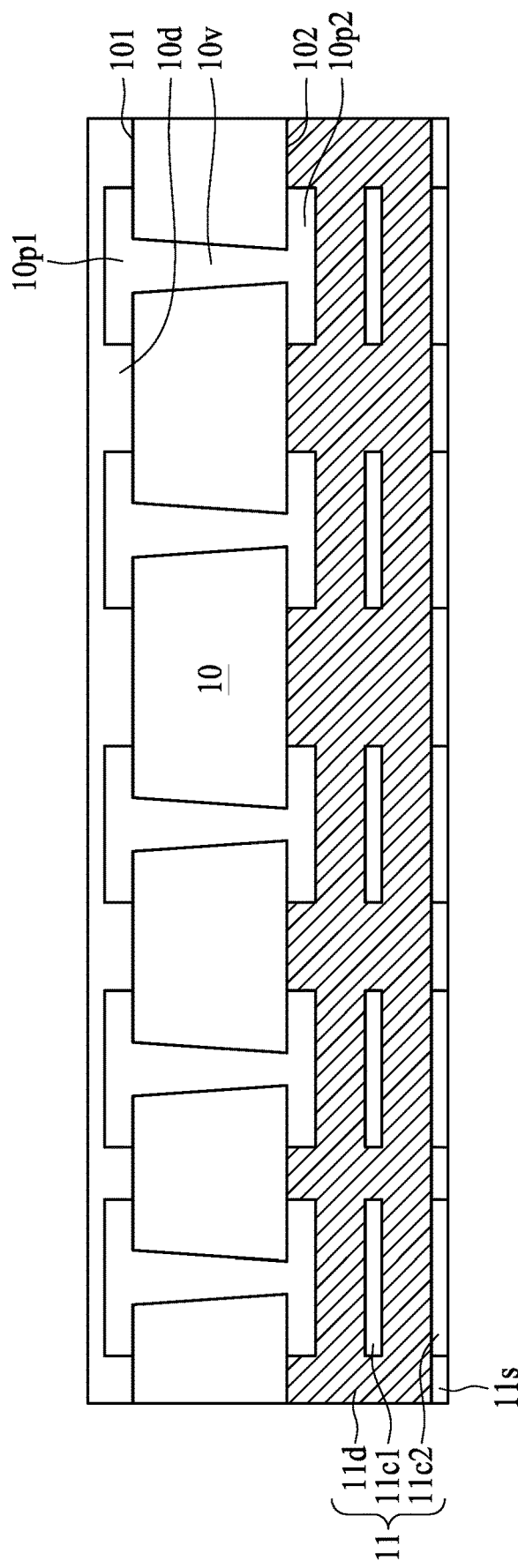

Referring to FIG. 5B, an antenna layer 11 including conductive layers 11$c$1, 11$c$2, a dielectric layer 11$d$ and a protection layer 11$s$ (e.g., solder resist) is formed on the surface 102 of the substrate 10. In some embodiments, the antenna layer 11 may be formed on the surface 102 of the substrate 10 by, for example, lamination or any other suitable processes. A protection layer 10$d$ (e.g., levelling layer) is formed on the surface 101 of the substrate 10 to cover the conductive layer 10$p$1.

Figure 5C:
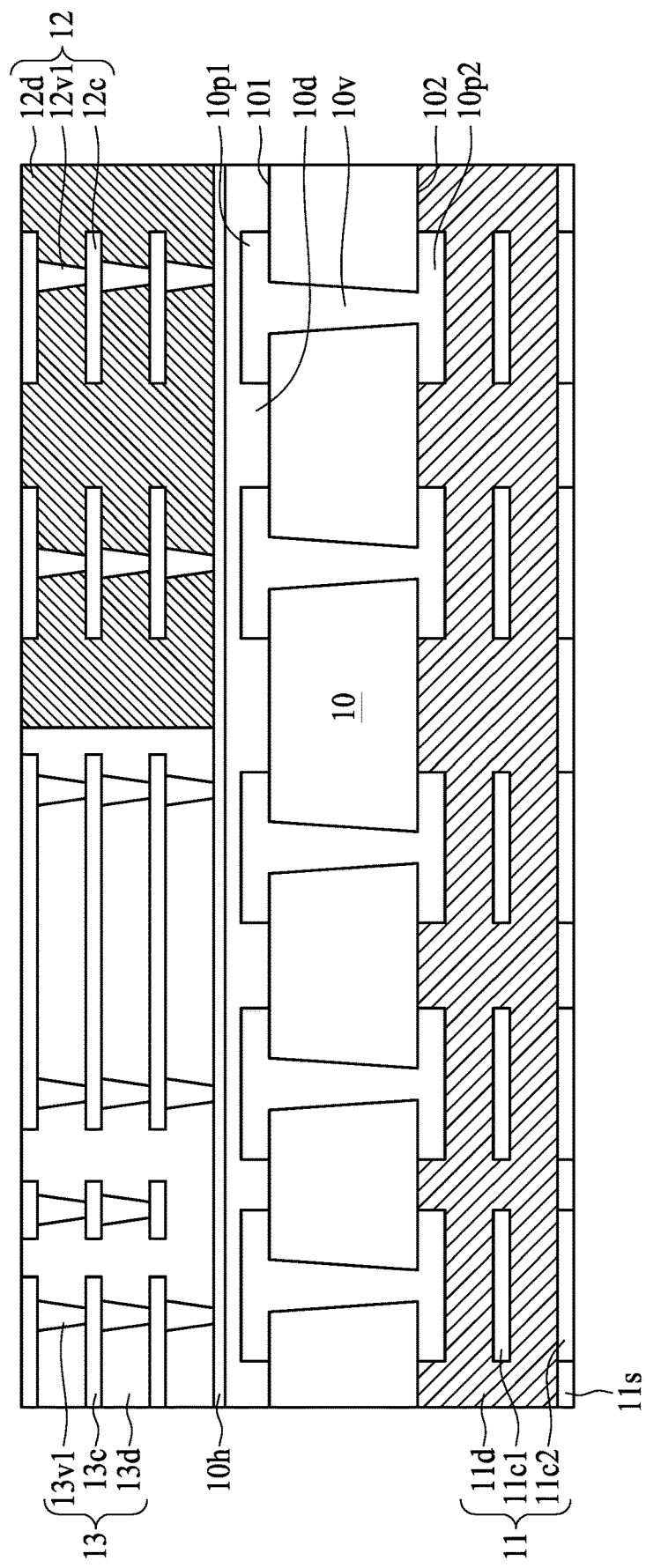

Referring to FIG. 5C, a circuit layer 12 including one or more conductive layers 12$c$, conductive vias 12$vi$ and dielectric layers 12$d$ is connected to the protection layer 10$d$ through an adhesive layer 10$h$ (e.g., a tape or a DAF). The conductive vias 12$vi$ are electrically connected to the conductive layers 12$c$ at different layers. A circuit layer 13 including a conductive layer 13$c$, a conductive via 13$vi$ and a dielectric layer 13$d$ is connected to the protection layer 10$d$ through an adhesive layer 10$h$. The conductive vias 13$vi$ are electrically connected to the conductive layers 13$c$ at different layers.

Figure 5D:
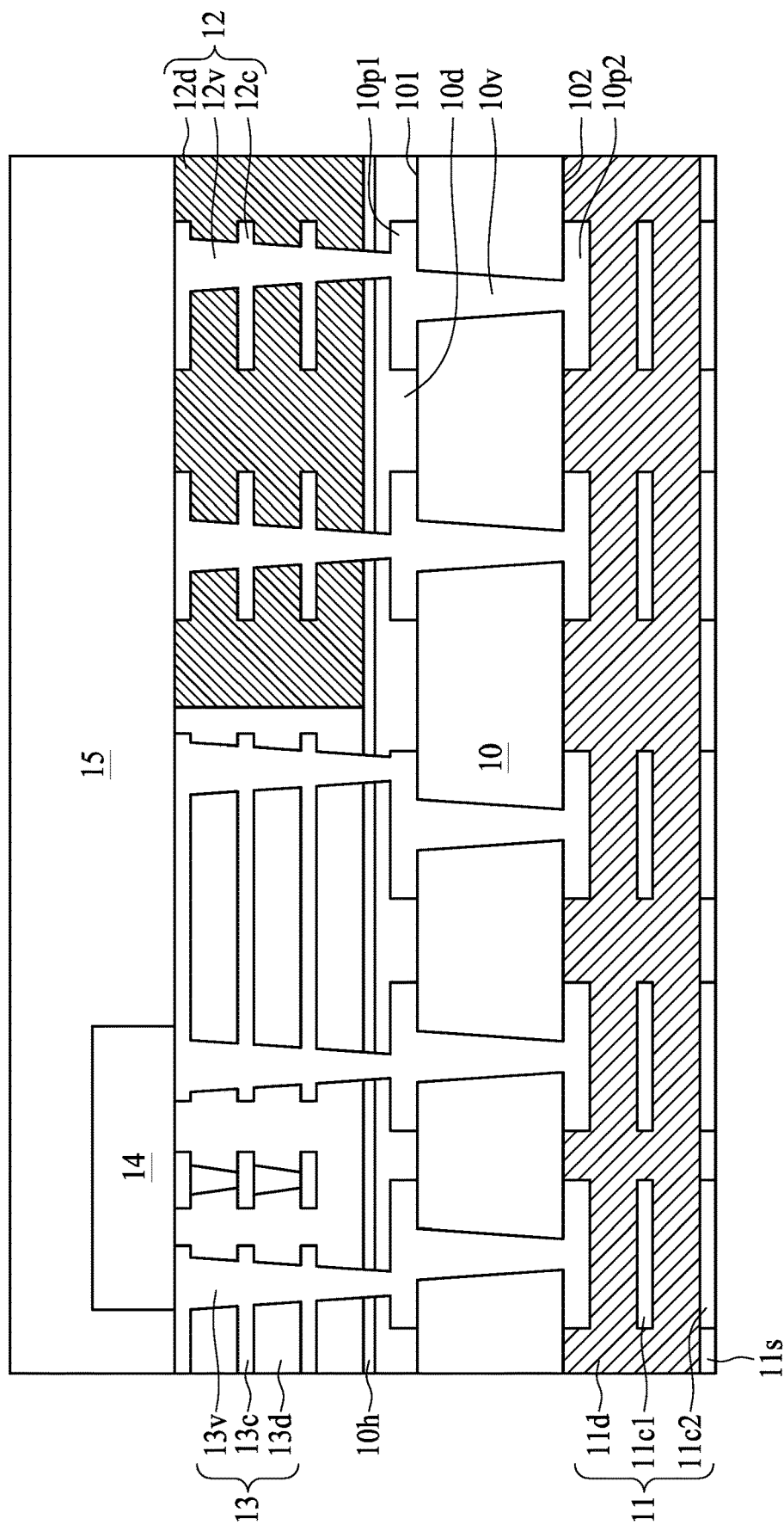

Referring to FIG. 5D, one or more conductive vias (e.g., through vias) 12$v$ are formed to penetrate the dielectric layer 12$d$, the adhesive layer 10$h$ and the protection layer 10$d$ to be electrically connected to the conductive layer 10$p$1. One or more conductive vias (e.g., through vias) 13$v$ are formed to penetrate the dielectric layer 13d, the adhesive layer 10h and the protection layer 10d to be electrically connected to the conductive layer 10p1.

An electronic component 14 is disposed on the circuit layer 13 and electrically connected to the circuit layer 13. A package body 15 is then formed on the circuit layers 12 and 13 to cover the electronic component 14 by, for example, molding or any other suitable techniques.

Figure 6A:
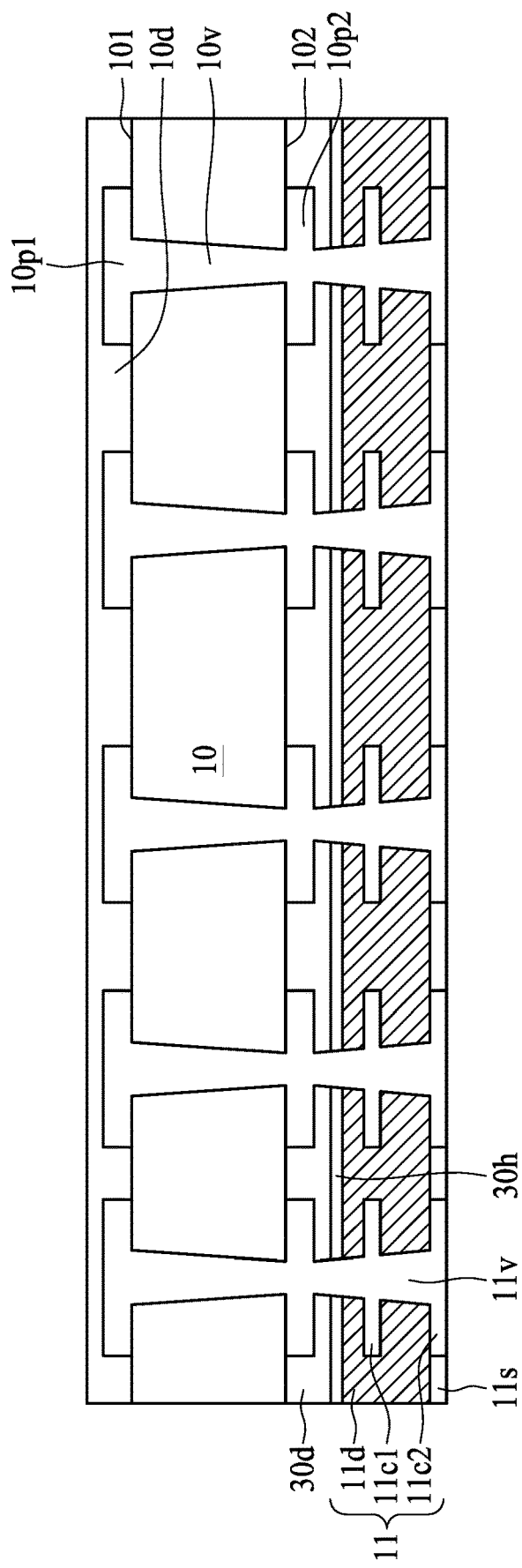
FIG. 6A, FIG. 6B and FIG. 6C illustrates one or more stages of a method of manufacturing a semiconductor device package in accordance with some embodiments of the present disclosure.
Figure 6B:
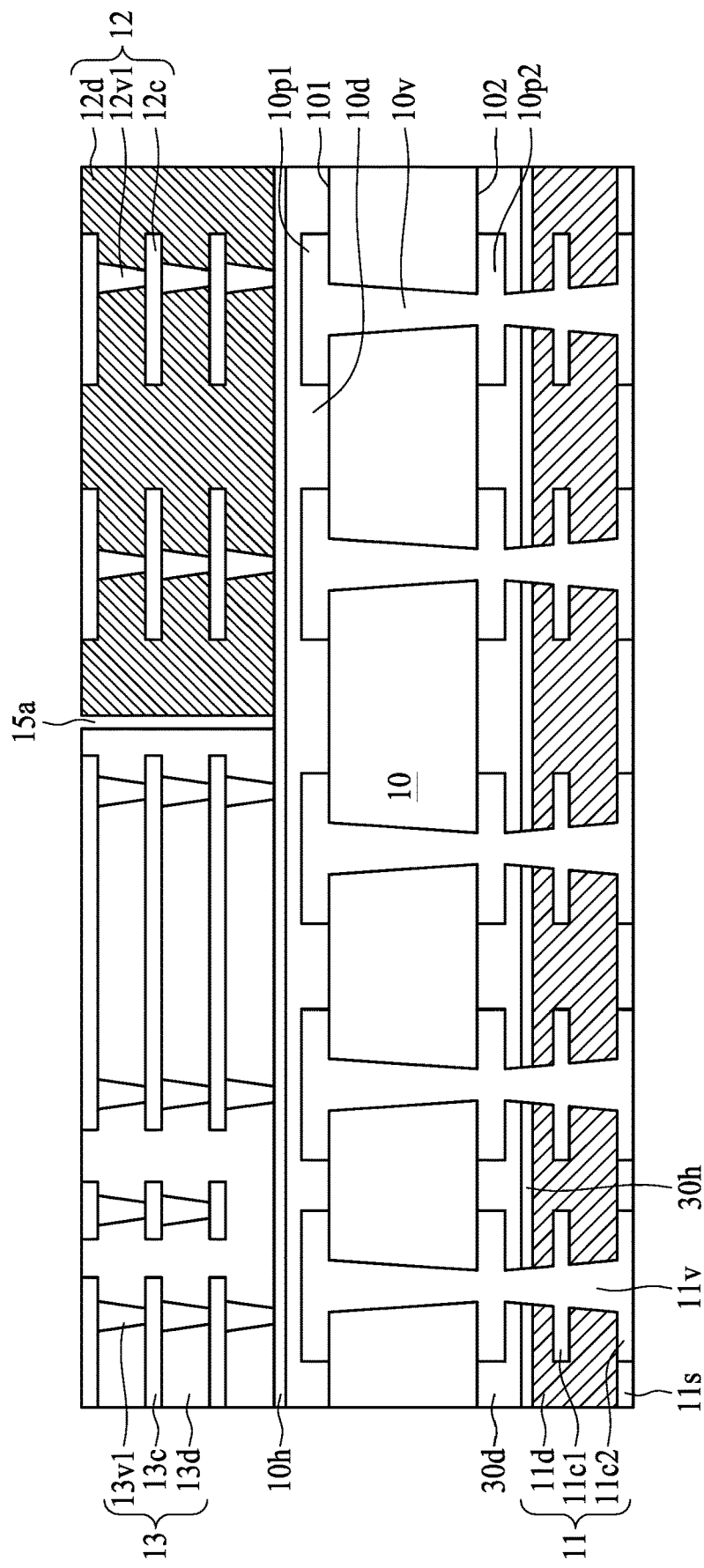
Figure 6C:
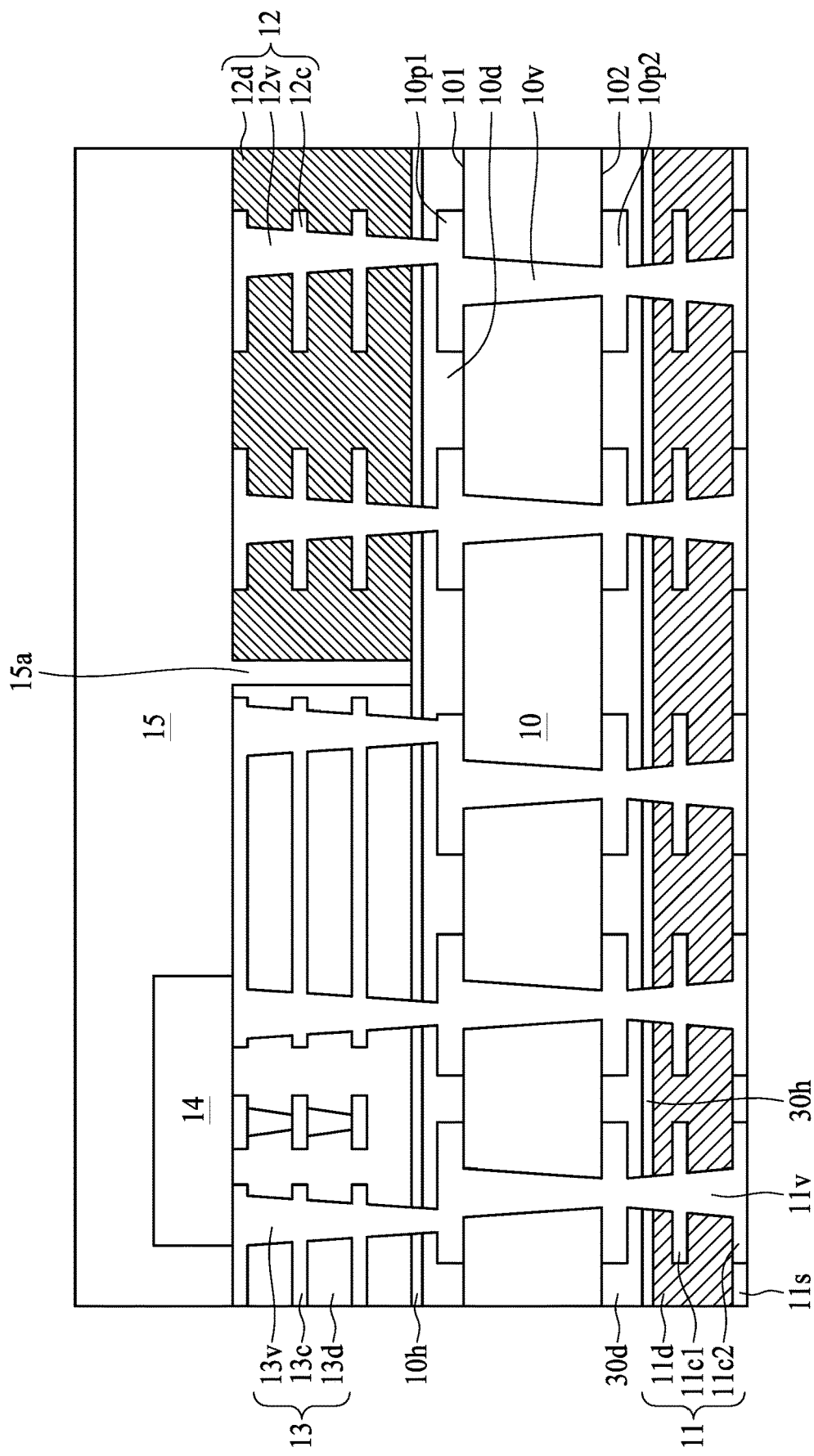

FIG. 6A, FIGS. 6B and 6C are cross-sectional views of a semiconductor device package at various stages of fabrication, in accordance with some embodiments of the present disclosure. At least some of these figures have been simplified for a better understanding of the aspects of the present disclosure. In some embodiments, the method illustrated in FIG. 6A, FIGS. 6B and 6C may be used to manufacture the semiconductor device package 4A as shown in FIG. 4A. In some embodiments, the operation in FIG. 6A may be carried out after the operation as shown in FIG. 5A.

Referring to FIG. 6A, a protection layer 30d (e.g., levelling layer) is formed on the surface 102 of the substrate 10 to cover the conductive layer 10p2. An antenna layer 11 including conductive layers 11c1, 11c2, a dielectric layer 11d and a protection layer 11s (e.g., solder resist) is connected to the protection layer 30d through an adhesive layer 30h (e.g., a tape or a DAF). A protection layer 10d (e.g., levelling layer) is formed on the surface 101 of the substrate 10 to cover the conductive layer 10p1.

Referring to FIG. 6B, a circuit layer 12 including one or more conductive layers 12c, conductive vias 12vi and dielectric layers 12d is connected to the protection layer 10d through an adhesive layer 10h (e.g., a tape or a DAF). The conductive vias 12vi are electrically connected to the conductive layers 12c at different layers. A circuit layer 13 including a conductive layer 13c, a conductive via 13vi and a dielectric layer 13d is connected to the protection layer 10d through an adhesive layer 10h. The conductive vias 13vi are electrically connected to the conductive layers 13c at different layers. The circuit layer 12 and the circuit layer 13 are spaced apart from each other. For example, there is a gap 15h between the circuit layer 12 and the circuit layer 13.

Referring to FIG. 6C, one or more conductive vias (e.g., through vias) 12v are formed to penetrate the dielectric layer 12d, the adhesive layer 10h and the protection layer 10d to be electrically connected to the conductive layer 10p1. One or more conductive vias (e.g., through vias) 13v are formed to penetrate the dielectric layer 13d, the adhesive layer 10h and the protection layer 10d to be electrically connected to the conductive layer 10p1.

An electronic component 14 is disposed on the circuit layer 13 and electrically connected to the circuit layer 13. A package body 15 is then formed on the circuit layers 12 and 13 to cover the electronic component 14 by, for example, molding or any other suitable techniques. The package body 15 is further formed within the gap 15h between the circuit layer 12 and the circuit layer 13. For example, a portion 15a of the package body 15 is disposed between the circuit layer 12 and the circuit layer 13. For example, a lateral surface of the circuit layer 12 facing the circuit layer 13 is in contact with the portion 15a of the package body 15, and a lateral surface of the circuit layer 13 facing the circuit layer 12 is in contact with the portion 15a of the package body 15.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (m) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An antenna structure, comprising:
   an antenna region having a first thickness, the antenna region comprising a first antenna and a second antenna configured to be operated with different frequencies; and
   a circuit region disposed over the antenna region and having a second thickness less than the first thickness of the antenna region.

2. The antenna structure of claim 1, wherein the antenna region includes a first dielectric layer having a third thickness, and the circuit region includes a second dielectric layer having a fourth thickness less than the third thickness.

3. The antenna structure of claim 1, wherein the antenna region includes a first conductive via tapered toward the circuit region.

4. The antenna structure of claim 3, wherein the circuit region includes a second conductive via tapered toward the antenna region.

5. The antenna structure of claim 1, wherein the antenna region includes a first dielectric layer having a first dielectric constant (Dk), and the circuit region includes a second dielectric layer having a second Dk greater than the first Dk of the first dielectric layer.

6. The antenna structure of claim 1, wherein a projection width of the first antenna on the circuit region and a projection width of the second antenna on the circuit region are non-overlapped in a cross-sectional view.

7. An antenna structure, comprising:
- an antenna layer including a first dielectric layer having a first coefficient of thermal expansion (CTE);
- a circuit layer including a second dielectric layer having a second CTE less than the first CTE; and
- a connection layer connecting the antenna layer to the circuit layer, wherein a material of the connection layer is different from a material of the first dielectric layer and the second dielectric layer.

8. The antenna structure of claim 7, wherein a portion of the connection layer extends beyond a lateral side of the circuit layer.

9. The antenna structure of claim 7, further comprises:
- a conductive element penetrating the connection layer and electrically connecting the antenna layer to the circuit layer.

10. The antenna structure of claim 9, further comprises:
- an electronic component disposed over the circuit layer and electrically connected with the antenna layer through the circuit layer and the conductive element.

11. The antenna structure of claim 10, further comprises:
- a package body encapsulating the electronic component.

12. The antenna structure of claim 11, wherein a lateral side of the package body and a lateral side of the circuit layer are substantially aligned.

13. The antenna structure of claim 10, wherein the antenna layer includes an antenna pattern vertically overlapped with the electronic component.

14. An antenna structure, comprising:
- an antenna layer comprising a first dielectric layer having a first CTE and a first width; and
- a first circuit layer disposed over the antenna layer and comprising a second dielectric layer, wherein the second dielectric layer has a second CTE less than the first CTE and a second width less than the first width.

15. The antenna structure of claim 14, wherein the second width is greater than a half of the first width.

16. The antenna structure of claim 14, wherein the antenna layer includes a first antenna pattern and a second antenna pattern vertically overlapped with the first antenna pattern.

17. The antenna structure of claim 16, wherein the first antenna pattern and the second antenna pattern are vertically non-overlapped with the first circuit layer.

18. The antenna structure of claim 14, further comprises:
- a second circuit layer disposed over the antenna layer and spaced apart from the first circuit layer.

19. The antenna structure of claim 18, wherein the second circuit layer is electrically connected with the first circuit layer through the antenna layer.

20. The antenna structure of claim 18, wherein a number of dielectric layers in the second circuit layer is different from a number of dielectric layers in the first circuit layer.

* * * * *